US008680582B2

(12) United States Patent
Anderson et al.

(10) Patent No.: US 8,680,582 B2
(45) Date of Patent: Mar. 25, 2014

(54) CIRCUIT AND METHOD FOR INTERCONNECTING STACKED INTEGRATED CIRCUIT DIES

(75) Inventors: Jacob Robert Anderson, Meridian, ID (US); William Jones, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 13/156,265

(22) Filed: Jun. 8, 2011

(65) Prior Publication Data

US 2011/0237029 A1 Sep. 29, 2011

Related U.S. Application Data

(60) Continuation of application No. 12/709,261, filed on Feb. 19, 2010, now Pat. No. 7,968,916, which is a division of application No. 11/800,472, filed on May 4, 2007, now Pat. No. 7,679,198.

(51) Int. Cl.
   *H01L 27/118* (2006.01)
(52) U.S. Cl.
   USPC ............ 257/203; 257/272; 257/777; 438/106
(58) Field of Classification Search
   USPC .......................................... 257/203, 272, 777
   See application file for complete search history.

(56) References Cited

U.S. PATENT DOCUMENTS

| 5,905,401 | A   |     | 5/1999  | Sher .............................. 327/525 |
| 6,133,054 | A   |     | 10/2000 | Henson ........................... 438/17   |
| 6,486,528 | B1  | *   | 11/2002 | Pedersen et al. .............. 257/529      |
| 6,674,173 | B1  |     | 1/2004  | Wang ............................. 257/777  |
| 6,847,105 | B2  |     | 1/2005  | Koopmans ..................... 257/686      |
| 7,173,340 | B2  |     | 2/2007  | Zhou et al. ..................... 257/777   |
| 2005/0212144 | A1 |    | 9/2005  | Rugg et al. .................... 257/782    |
| 2005/0285248 | A1 |    | 12/2005 | See et al. ....................... 257/681  |
| 2006/0278979 | A1 |    | 12/2006 | Rangel .......................... 257/734   |

OTHER PUBLICATIONS

International Search Report and Written Opinion in International Application No. PCT/US2008/062280 mailed Oct. 21, 2008.
English translation of First Office Action of China State Intellectual Property Office for Application No. 200880014535.7 issued on Jul. 30, 2010.
English Translation of KIPO's Notice of Preliminary Rejection for Korean Patent Application No. 10-2009-7025237, issued Mar. 15, 2011.
English translation of Office Action for Taiwanese Patent Application No. 097116358 issued on Sep. 28, 2011.

* cited by examiner

*Primary Examiner* — Thao Le
*Assistant Examiner* — Geoffrey Ida
(74) *Attorney, Agent, or Firm* — Dorsey & Whitney LLP

(57) ABSTRACT

Signals are routed to and from identical stacked integrated circuit dies by selectively coupling first and second bonding pads on each of the dies to respective circuits fabricated on the dies through respective transistors. The transistors connected to the first bonding pads of an upper die are made conductive while the transistors connected to the second bonding pads of the upper die are made non-conductive. The transistors connected to the second bonding pads of a lower die are made conductive while the transistors connected to the first bonding pads of the lower die are made non-conductive. The second bonding pads of the upper die are connected to the second bonding pads of the lower die through wafer interconnects extending through the upper die. Signals are routed to and from the circuits on the first and second dies through the first and second bonding pads, respectively.

22 Claims, 5 Drawing Sheets

CIRCUIT AND METHOD FOR INTERCONNECTING STACKED INTEGRATED CIRCUIT DIES

CROSS-REFERENCE TO RELATED APPLICATIONS

This application is a continuation of U.S. patent application Ser. No. 12/709,261, filed Feb. 19, 2010, U.S. Pat. No. 7,968,916, which is a divisional of U.S. patent application Ser. No. 11/800,472, filed May 4, 2007, U.S. Pat. No. 7,679,198. These applications are incorporated by reference herein in their entirety and for all purposes.

TECHNICAL FIELD

This invention relates generally to integrated circuits, and, more particularly, to a circuit and method for routing signals to and from a plurality of integrated circuit dies that are in a stacked configuration.

BACKGROUND OF THE INVENTION

Integrated circuits are fabricated on wafers of a semiconductor substrate. After the integrated circuits have been fabricated on the wafer, they are "singulated," i.e., separated from each other, to provide a plurality of semiconductor dies. Each semiconductor die is typically placed in a package having externally accessible terminals that are connected by bonding wires to respective bonding pads fabricated on the die.

Each integrated circuit package most commonly contains a single integrated circuit die. However, it is sometimes desirable to place two or more integrated circuit dies in a single package. For example, if the integrated circuit is a memory device, such as a flash memory device, the desired capacity of the memory device may exceed the currently available capacity of memory device dies. If, for example, a user desires a 16 GB flash memory device and the maximum available capacity of flash memory device dies is only 8 GB, a 16 GB flash memory device can be provided by placing two of the memory device dies in the package.

Multiple memory device dies may be packaged together using a variety of techniques. One common technique is to stack one or more of the dies on top of another, which is known as a "stacked die" configuration. However, in a stacked die configuration, only the top die is generally accessible for routing power and signals to and from the die. Signals generally cannot be routed directly to bonding pads on the lower die because the upper die covers the bonding pads on the lower die. Bonding pads could be made accessible on the lower die by fabricating the lower die in a configuration that spatially mirrors the configuration of the upper die, and by turning the lower die upside down so that its bonding pads face downwardly. However, this technique would require that two different versions of the die—an upper die configuration and a lower die configuration—be manufactured. Yet economic considerations make this approach undesirable. Also, this approach would not allow more than two dies to be stacked since the bonding pads on the middle die(s) would not be accessible.

The most common approach to stacking dies in a manner that solves the above problems is to fabricate extra bonding pads on the dies. The extra bonding pads on the upper die are connected to interconnects extending through the dies to pads formed on the lower surface of the dies. The bonding pads on the lower surface of the upper die are connected to respective bonding pads on the upper surface of the lower die to allow signals to be coupled to and from the lower die through the extra bonding pads fabricated on the upper die. For example, a data signal, such as data signal D0 for data bit 0 is applied to a bonding pad fabricated on the upper die, and it is also applied through the interconnect to the corresponding bonding pad fabricated on the lower die, which is located directly beneath the bonding pad on the upper die. The data signals can be applied to both dies in this manner because, in certain devices, such as memory devices, the signals are common to both dies. Other signals that may be common to multiple stacked memory device dies are address signals and clock signals. Ground and power will also generally be common to both dies. However, certain other signals are not common to both dies and must instead be individually applied to each die. For example, in the context of memory devices, separate chip select CS, clock enable CKE, and on die termination ODT signals must be individually applied to each die. Additionally, an impedance ZR pad fabricated on each die must be separately accessible.

Signals are typically applied separately to stacked die using the prior art approach shown in FIG. 1, it being understood that FIG. 1 shows only a few of the signals that are normally applied to stacked memory device dies. As shown in FIG. 1, an upper die 10 is stacked on an identical lower die 12. Upper surfaces 16 of each die 10, 12 have formed thereon respective pairs of bonding pads 20, 22 for signals that are common to both dies 10, 12. For example, the D0 signal may be received by and transmitted from the bonding pad 20, and a bit of an address signal A0 may be received by the bonding pad 22. The bonding pads 20, 22 are connected to a respective circuit 24 that is also fabricated on the upper surfaces 16 of each die 10, 12. With reference also to FIG. 2, the bonding pads 20, 22 are connected through respective interconnects 26, 28 extending through the dies 10, 12 and connected to respective pads 30, 32 fabricated on a lower surface 36 of each die 10, 12. Insofar as the pads 30, 32 are directly beneath the bonding pads 20, 22, respectively, the bonding pads 30, 32 of the upper die 10 can be positioned directly on top of the bonding pads 20, 22, respectively, on the upper surface 16 of the lower die 12. As a result, signals applied to and/or received from the bonding pads 20, 22 on the upper die 10 can be applied to and/or received from the bonding pads 20, 22 on the lower die 12.

As mentioned above, some signals must be individually applied to each of the die 10, 12. With further reference to FIG. 1, a chip select CS signal for the upper die 10 is applied to a bonding pad 40a, a clock enable CKE signal for the upper die 10 is applied to a bonding pad 42a, an on-die termination ODT signal for the upper die 10 is applied to a bonding pad 44a, and an impedance test node ZR for the upper die 10 is available through a bonding pad 46a, all of which are connected to the circuit 24 fabricated on the upper surface 16 of the respective dies 10, 12. However, extra bonding pads 40b, 42b, 44b, 46b corresponding to the bonding pads 40a, 42a, 44a, 46a, respectively, are also fabricated on the upper surface of each die 10, 12. These bonding pads 40b, 42b, 44b, 46b are for the CS, CKE and ODT signals and the ZR test node for the lower die 12. With further reference to FIG. 2, the bonding pads 40b, 42b, 44b, 46b are connected to respective interconnects 46, 47, 48, 49 extending through the dies 10, 12 to respective pads 50, 52, 54, 56 fabricated on a lower surface 36 of each of the dies 10, 12. This configuration allows the CS, CKE and ODT signals applied to the bonding pads 40b, 42b, 44b respectively, of the upper die 10 to be applied to the bonding pads 40b, 42b, 44b of the lower die 12, and the ZR test node accessible through the bonding pad 46b of the upper die 10 to be applied to the bonding pad 46b of the lower die 12. However, the bonding pads 40b, 42b, 44b, 46b cannot be connected to the circuits 24 fabricated on the dies 10, 12 or else the CS, CKE and ODT signals applied to the bonding pads 40b, 42b, 44b of the upper die 10 and the ZR test point of the upper die 10 would be coupled to the circuits 24 fabricated on both dies 10, 12. This problem could be solved by fabricating a lower die 12 with a different topography from the upper die 10, e.g., coupling the circuit 24 of the lower die 12 to the bonding pads 40b, 42b rather than to the bonding pads 40a, 42a. However, as mentioned above, for economic reasons, it is generally desirable to make both die 10, 12 identical to each other.

The above-described problem is generally solved by positioning an insulative redistribution layer 60 between the lower surface 36 of the upper die 10 and the upper surface 16 of the lower die 12. The redistribution layer 60 has pads 62, 64, 66, 68 fabricated on an upper surface 69 of the redistribution layer 60 that are in alignment with, and in contact with, the pads 50, 52, 54, 56 respectively, fabricated on a lower surface 36 of the upper die 10. The pads 62, 64, 66, 68 are coupled through respective conductors 70, 72, 74, 76 to pads 80, 82, 84, 86 respectively, fabricated on a lower surface 88 of the redistribution layer 60. The pads 80, 82, 84, 86 are in alignment with, and in contact with, the bonding pads 40a, 42b, 44b, 46b, respectively, fabricated on a upper surface 36 of the lower die 12. As a result, the CS, CKE, ODT and ZR bonding pads 40b, 42b, 44b, 46b of the upper die 10 are coupled to the bonding pads 40a, 42a, 44b, 46b of the lower die 12, which are coupled to the circuit 24 fabricated on the lower die 12.

The use of the redistribution layer 60, while necessary, produces some undesired consequences. There is not only the expense of fabricating the redistribution layer 60 and the expense of assembling it with the dies 10, 12, but it also creates signal paths for the signals applied to the upper die 10 that can be significantly longer than the signal paths for the signals applied to the lower die 12. For example, the path lengths of the CS, CKE and ODT signals applied to the lower die 12 are increased by the distances between the pads 40b, 42b, 44b on the upper die 10 and the pads 40b, 42b, 44b on the lower die 12. As a result, the upper die 10 can respond to signals at times that are different from the times that the lower die 12 can respond to signals, which can produce undesired consequences.

There is therefore a need for an improved technique for separately routing signals to and/or from stacked integrated circuit dies.

DETAILED DESCRIPTION

Figure 3:
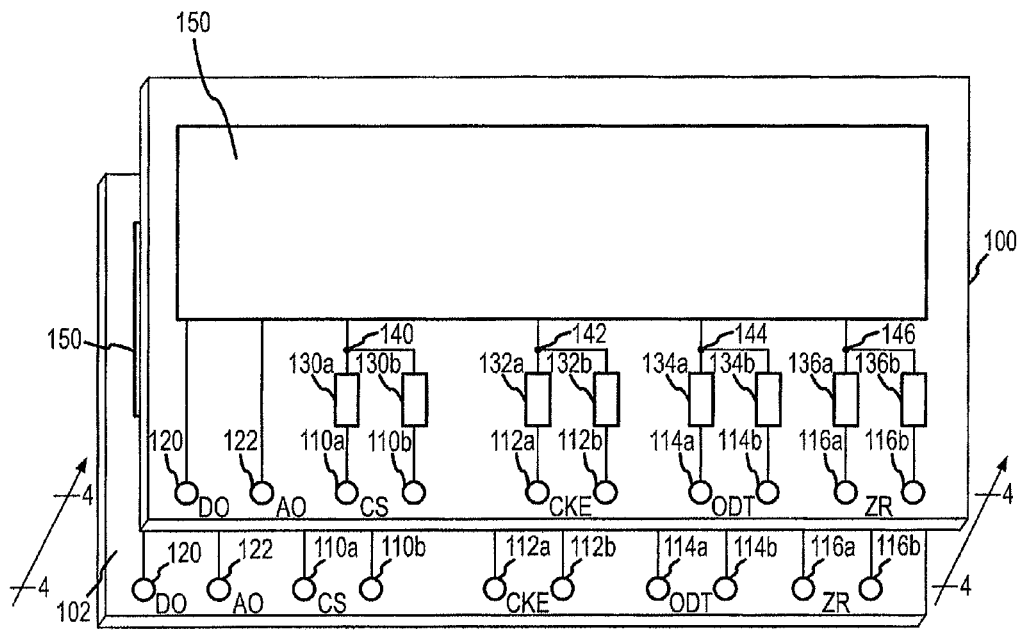
FIG. 3 is a schematic drawing showing a technique for routing signals to and/or from stacked integrated circuit dies according to an embodiment of the invention.

An improved technique for separately routing signals to and/or from stacked integrated circuit dies according to an embodiment of the invention is shown in FIG. 3. In the interests of brevity and clarity, FIG. 3 shows only two stacked integrated circuit dies 100, 102, it being understood that additional dies may be stacked on one another. The dies 100, 102 are identical to each other. Also, FIG. 3 shows only one data signal D0 and one address signal A0 that are common to both dies 100, 102, coupled to and/or from the dies 100, 102. However, it will be understood that a substantially greater number of signals that are common to both dies 100, 102 may be coupled to and/or from the dies 100, 102 using the same technique. FIG. 3 also shows only three signals CS, CKE and ODT that are individually coupled to the dies 100, 102, and one test point ZR that is individually accessed in the dies 100, 102. Again, it will be understood that a substantially greater number of signals may be individually coupled to and/or from each die 100, 102, and additional, individually accessed test points may be accessed using the same technique.

With reference to FIG. 3, each of the dies 100, 102 includes a pair of bonding pads for each of the signals that is individually coupled to the dies 100, 102 and for each test point that is individually accessed in the dies 100, 102. Specifically, a pair of bonding pads 110a,b are provided for applying the CS signals to the upper and lower dies 100, 102, respectively, a pair of bonding pads 112a,b are provided for applying the CKE signals to the upper and lower dies 100, 102, respectively, and another pair of bonding pads 114a,b are provided for applying the ODT signals to the upper and lower dies 100, 102, respectively. Finally, a pair of bonding pads 116a,b are provided for accessing the ZR test points in the upper and lower dies 100, 102, respectively. A single bonding pad 120 is provided for routing the D0 signal to and from both dies 100, 102, and a single bonding pad 122 is provided for routing the A0 signal to both dies 100, 102. It will be recalled that these signals D0 and A0 are common to both dies 100, 102.

Each pair of the bonding pads fabricated on the dies 100, 102 is coupled to a common node through respective controllable impedance devices. Specifically, the bonding pads 110a,b are coupled through respective controllable impedance devices 130a,b to node 140, the bonding pads 112a,b are coupled through respective controllable impedance devices 132a,b to node 142, the bonding pads 114a,b are coupled through respective controllable impedance devices 134a,b to node 144, and the bonding pads 116a,b are coupled through respective controllable impedance devices 136a,b to node 146. The nodes 140-146 are connected to respective circuits 150 fabricated on the dies 100, 102.

Figure 4:
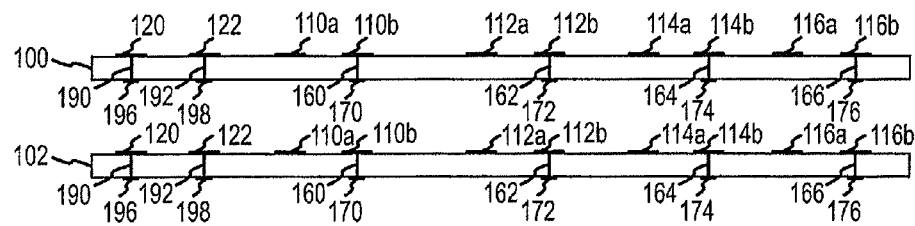
FIG. 4 is a cross-sectional view of the stacked integrated circuit dies shown in FIG. 3 taken along the line 4-4 of FIG. 3.

With reference also to FIG. 4, the bonding pads 110b, 112b, 114b, 116b are connected through respective wafer interconnects 160, 162, 164, 166 to respective pads 170, 172, 174, 176 fabricated on the lower surface of each of the dies 100, 102. The pads 170, 172, 174, 176 are aligned with the bonding pads 110b, 112b, 114b, 116b. As a result, when the upper die 100 is placed on top of the lower die 102, the pads 170, 172, 174, 176 of the upper die 100 can directly contact the bonding pads 110*b*, 112*b*, 114*b*, 116*b* of the lower die 102. The bonding pads 110*b*, 112*b*, 114*b*, 116*b* of the upper die 100 are therefore coupled to the bonding pads 110*b*, 112*b*, 114*b*, 116*b* of the lower die 102.

Figure 1:
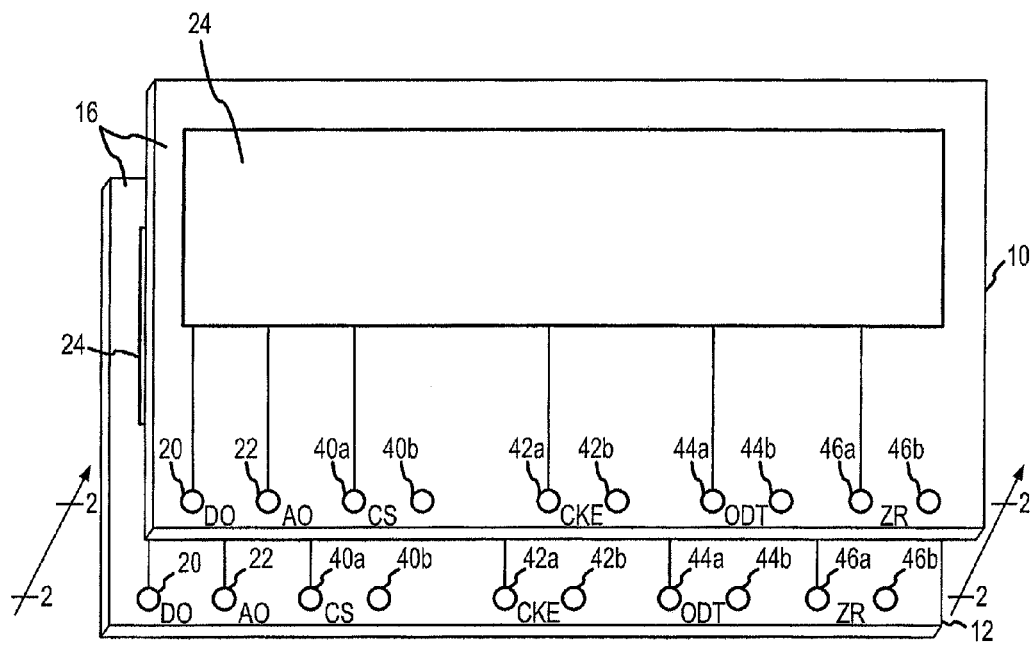
FIG. 1 is a schematic drawing showing a prior art technique for routing signals to and/or from stacked integrated circuit dies.
Figure 2:
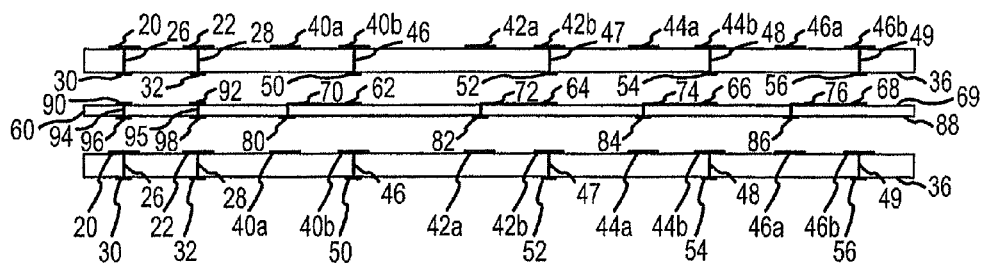
FIG. 2 is a cross-sectional view of the stacked integrated circuit dies shown in FIG. 1 taken along the line 2-2 of FIG. 1.

A bonding pad 120 for the D0 signal and the bonding pads 122 for the A0 signal are also connected through respective wafer interconnects 190, 192 to respective pads 196, 198 fabricated on the lower surface of each of the dies 100, 102. The pads 196, 198 are aligned with the bonding pads 120, 122. As a result, when the upper die 100 is placed on top of the lower die 102, the pads 196, 198 of the upper die 100 can directly contact the bonding pads 120, 122 of the lower die 102. The bonding pads 120, 122 of the upper die 100 are therefore coupled to the bonding pads 120, 122 of the lower die 102 in essentially the same manner as the prior art stacked dies 10, 12 shown in FIGS. 1 and 2.

In operation, the controllable impedance devices 130-136 are selectively closed during fabrication and prior to packaging to make each of the die either an upper die 100 or a lower die 102. Specifically, for the upper die 100, the controllable impedance devices 130*a*, 132*a*, 134*a*, 136*a* are closed (i.e., at a low impedance) and the controllable impedance devices 130*b*, 132*b*, 134*b*, 136*b* are opened (i.e., at a high impedance). Conversely, for the lower die 102, the controllable impedance devices 130*b*, 132*b*, 134*b*, 136*b* are closed and the controllable impedance devices 130*a*, 132*a*, 134*a*, 136*a* are opened. As a result, the bonding pads 110*a*, 112*a*, 114*a*, 116*a* are connected to the circuit 150 fabricated on the upper die 100, and the bonding pads 110*b*, 112*b*, 114*b*, 116*b* on the upper die 100 are isolated from the circuit 150 fabricated on the upper die 100. The bonding pads 110*b*, 112*b*, 114*b*, 116*b* on the upper die 100 are instead connected to the circuit 150 fabricated on the lower die 102, and the bonding pads 110*a*, 112*a*, 114*a*, 116*a* fabricated on the lower die 102 are isolated from the circuit 150 fabricated on the upper die 100. As a result, signals can be applied to the circuit 150 of the upper die 100 by applying the signals to the bonding pads 110*a*, 112*a*, 114*a*, 116*a*, and signals can be applied to the circuit 150 of the lower die 102 by applying the signals to the bonding pads 110*b*, 112*b*, 114*b*, 116*b*.

The controllable impedance devices 130-136 can be a variety of devices. In some embodiments, the controllable impedance devices 130-136 can be laser fuses that are selectively trimmed as described above during fabrication. In other embodiments, the controllable impedance devices 130-136 can be anti-fuses that are selectively trimmed as described above during fabrication. Other devices that can be used as the controllable impedance devices 130-136 will be apparent to one skilled in the art. As described below with reference to FIG. 5, the controllable impedance devices 130-136 can also be semiconductor devices, such as transistors.

Figure 5:
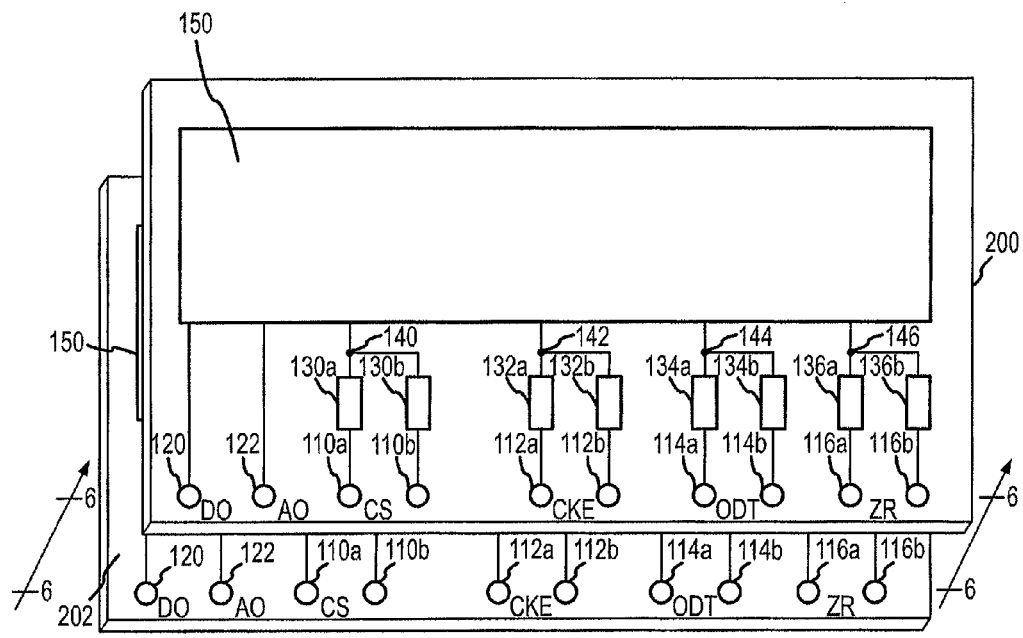
FIG. 5 is a schematic drawing showing a technique for routing signals to and/or from stacked integrated circuit dies according to another embodiment of the invention.
Figure 6:
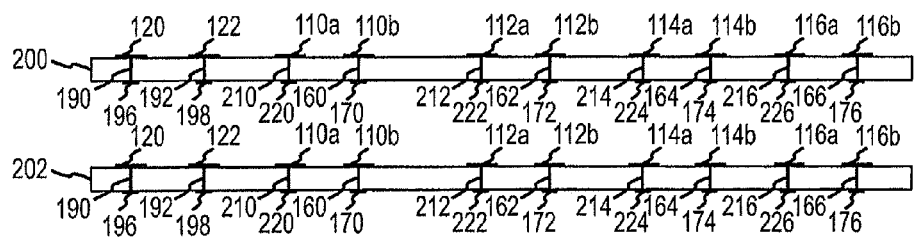
FIG. 6 is a cross-sectional view of the stacked integrated circuit dies shown in FIG. 5 taken along the line 6-6 of FIG. 5.

A pair of stacked dies 200, 202 according to another embodiment is shown in FIGS. 5 and 6. This embodiment uses many of the same components and structures used in the stacked dies 100, 102 shown in FIGS. 3 and 4. Therefore, in the interest of brevity and clarity, the same reference numerals will be used for these common components and structures, and an explanation of their function and operation will not be repeated. The dies 200, 202 differ from the dies 100, 102 shown in FIGS. 3 and 4 by using extra wafer interconnects for connecting the bonding pads 110*a*, 112*a*, 114*a*, 116*a*, formed on the upper die 200 with the bonding pads 110*a*, 112*a*, 114*a*, 116*a*, respectively, formed on the lower die 202. The bonding pads 110*a*, 112*a*, 114*a*, 116*a*, of the upper die 200 are connected to the bonding pads 110*a*, 112*a*, 114*a*, 116*a*, respectively, of the lower die 202 in essentially the same manner that the bonding pads 110*b*, 112*b*, 114*b*, 116*b* of the upper die 200 are connected to the bonding pads 110*b*, 112*b*, 114*b*, 116*b*, respectively, of the lower die 202. Specifically, the bonding pads 110*a*, 112*a*, 114*a*, 116*a* are connected through respective wafer interconnects 210, 212, 214, 216 to respective pads 220, 222, 224, 226 fabricated on the lower surface of each of the dies 200, 202. When the upper die 200 is placed on top of the lower die 202, the pads 220, 222, 224, 226 of the upper die 200 directly contact the bonding pads 110*a*, 112*a*, 114*a*, 116*a* of the lower die 202. The bonding pads 110*a*, 112*a*, 114*a*, 116*a* of the upper die 200 are therefore coupled to the bonding pads 110*b*, 112*b*, 114*b*, 116*b* of the lower die 202.

As mentioned above, the controllable impedance devices 130*a*-136*a* fabricated on the lower die 202 are normally open. The signals applied to the bonding pads 110*a*, 112*a*, 114*a*, 116*a* of the upper and lower dies 200, 202, respectively, are therefore not normally applied to the circuit 150 on the lower die 202. However, the interconnects 210, 212, 214, 216 and respective pads 220, 222, 224, 226 add capacitance to the bonding pads 110*a*, 112*a*, 114*a*, 116*a* so that the capacitance at the bonding pads 110*a*, 112*a*, 114*a*, 116*a* match the capacitance at the bonding pads 110*b*, 112*b*, 114*b*, 116*b*. As a result, signals applied to the upper die 200 can have substantially the same timing characteristics as the signals applied to the lower die 202.

Although only pairs of stacked dies 100, 102 and 200, 202 are shown in FIGS. 3-6, additional numbers of dies may be stacked in a manner similar to that shown in FIGS. 3-6. In general, N dies having M signal pads may be stacked by including N*M bonding pads and pass transistors on each of the dies, where N is a positive integer greater than 1, and M is a positive integer greater than or equal to 1. For example, two signals could be applied to eight stacked dies (not shown) by fabricating 16 bonding pads and pass transistors on each of the dies.

Figure 7:
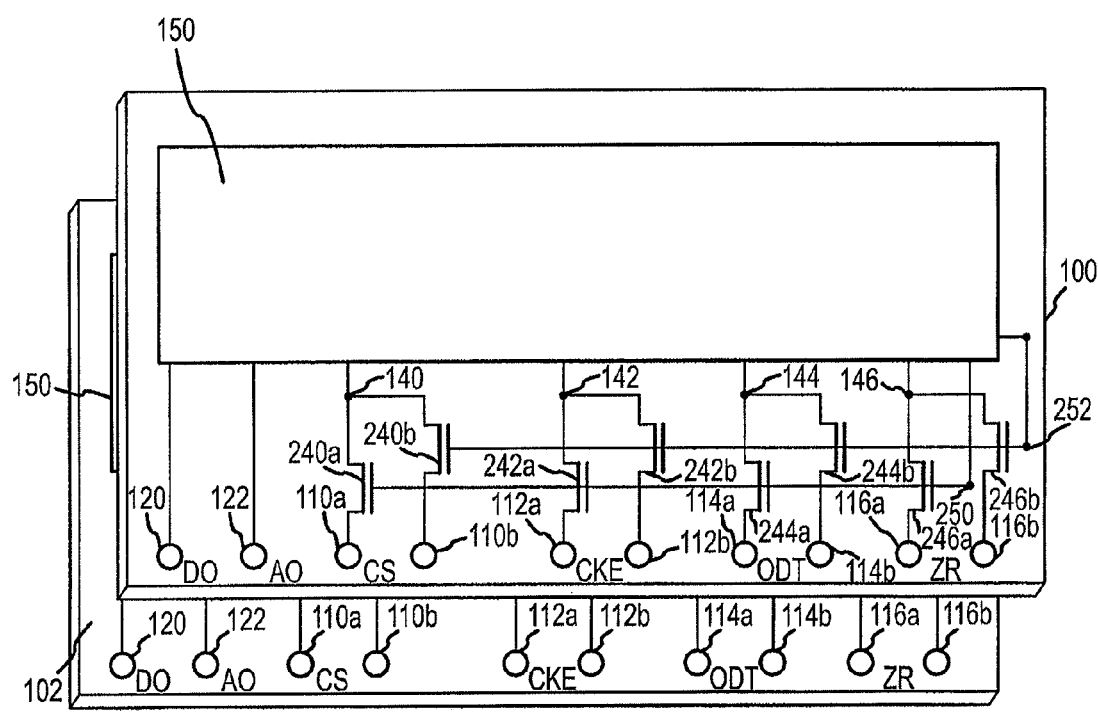
FIG. 7 is a schematic drawing showing a technique for routing signals to and/or from stacked integrated circuit dies according to another embodiment of the invention.

As mentioned above, the controllable impedance devices 130-136 can be semiconductor devices, such as transistors. With reference to FIG. 7, in another embodiment of the invention, the bonding pads 110*a*,*b* are coupled through respective transistors 240*a*,*b* to the node 140, the bonding pads 112*a*,*b* are coupled through respective transistors 242*a*,*b* to node 142, the bonding pads 114*a*,*b* are coupled through respective transistors 244*a*,*b* to node 144, and the bonding pads 116*a*,*b* are coupled through respective transistors 246*a*,*b* to node 146. As explained above, the nodes 140-146 are connected to the respective circuits 150 fabricated on the dies 100, 102. A gate of a first transistor 240*a*, 242*a*, 244*a*, 246*a* in each of the transistor pairs is connected to a first node 250, and a gate of a second transistor 240*b*, 242*b*, 244*b*, 246*b* in each of the transistor pairs is connected to a second node 252. In some embodiments, the circuits 150 fabricated on each of the dies 100, 102 include a fuse, anti-fuse or other non-volatile circuit element that is programmed to determine whether the die is an upper die 100 or a lower die 102. Such fuses or anti-fuses, for example, can be programmed either electrically or by a laser during packaging by conventional means. For example, the fuse, anti-fuse or other non-volatile circuit element in the circuit 150 may apply a high enabling signal to the first node 250 and a low enabling signal to the second node 252, thus making the die an upper die 100. On the other hand, the fuse, anti-fuse or other non-volatile circuit element in the circuit 150 may apply a low enabling signal to the first node 250 and a high enabling signal to the second node 252, thus making the die a lower die 102. The enabling voltage preferably has a magnitude that is sufficiently greater than any signal applied to the transistors 240-246 so that the transistors can pass the full magnitudes of the signals. As a result, signals can be applied to the circuit 150 of the upper die 100 by applying the signals to the bonding pads 110a, 112a, 114a, 116a, and signals can be applied to the circuit 150 of the lower die 102 by applying the signals to the bonding pads 110b, 112b, 114b, 116b.

Figure 8:
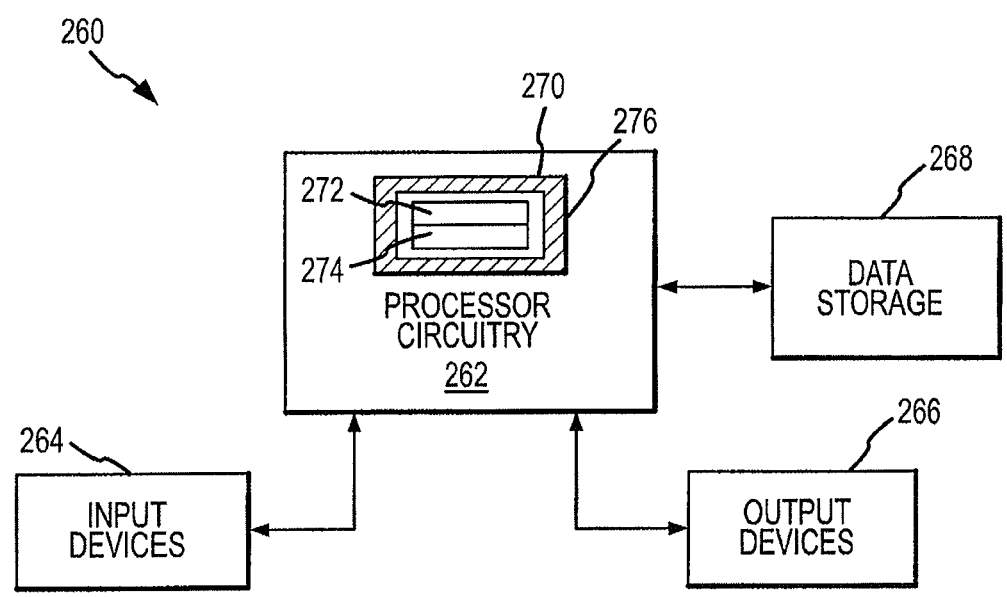
FIG. 8 is a block diagram of an embodiment of a system using a pair of stacked dies as shown in FIGS. 3-7 or according to some other embodiment of the invention.

An embodiment of a system 260 using an integrated circuit having a pair of stacked dies is shown in FIG. 8. The system 260 includes a processor (not shown), such as one where the processor is part of processor circuitry 262. The processor circuit 262 may include a non-volatile memory device 270. The memory device 270 includes a pair of stacked dies 272, 274 packaged in a housing 276 and interconnected as explained above with reference to FIGS. 3-7 or according to some other embodiment of the invention. The processor circuitry 262 is coupled through address, data, and control buses to the non-volatile memory device 270 to provide for writing data to and reading data from the non-volatile memory device 270. The processor and/or processor circuitry 262 includes circuitry for performing various processing functions, such as executing specific software to perform specific calculations or tasks. The system 260 also includes one or more input devices 264 coupled to the processor circuitry 262 to allow an operator to interface with the system 260. Examples of input devices 264 include keypads, touch screens, and scroll wheels. The system 260 also includes one or more output devices 266 coupled to the processor circuitry 262 to provide output information to the operator. In one example, the output device 266 is a visual display providing visual information to the operator. Data storage 268 is also coupled to the processor circuitry 262 to store data that is to be retained even when power is not supplied to the system 260 or to the data storage 268.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit die, comprising:
   a plurality of sets of pads, each set comprising two pads, wherein each pad in the plurality of sets of pads is configured for external connection;
   a circuit;
   a plurality of sets, of controllable impedance devices, each controllable impedance device in the plurality of sets of controllable impedance devices coupling a respective one of the pads in the plurality of sets of pads to the circuit, each controllable impedance device in the plurality of sets of controllable impedance devices configured to have an impedance controlled responsive to a respective control signal, the controllable impedance devices in the plurality of sets of controllable impedance devices coupled to one of the pads of each of the plurality of sets of pads being coupled to a common signal line and being configured to receive the control signal through the common signal line; and
   a programmable element configured to control the impedances of the plurality of controllable impedance devices in the plurality of sets of controllable impedance devices by providing the control signal to the common signal line.

2. The integrated circuit die of claim 1, wherein at least one set of the plurality of sets of pads comprises eight pads.

3. The integrated circuit die of claim 1, wherein the plurality of sets of pads further comprises a set of dedicated pads, each pad in the set of dedicated pads coupled to the circuit, and wherein none of the pads in the set of dedicated pads are coupled to any of the plurality of sets of controllable impedance devices.

4. The integrated circuit die of claim 1, wherein each controllable impedance device in the plurality of sets of controllable impedance devices comprises a transistor.

5. The integrated circuit die of claim 4, wherein the programmable element is configured to provide the control signal to the common signal line during operation of the integrated circuit die.

6. The integrated circuit die of claim 1, wherein the circuit is a first circuit, and further comprising:
   a second circuit, distinct from the first circuit, wherein the second circuit comprises the programmable element.

7. An integrated circuit die, comprising:
   a circuit;
   a plurality of sets of pads, each set comprising two pads, wherein each pad in the plurality of sets of pads is exposed at an external surface of the integrated circuit die and is configured for external connection through said exposure at the external surface; and
   a plurality of connection devices;
   wherein one of the pads in each set of the plurality of sets of pads is selectively coupled through a respective connection device of the plurality of connection devices to the circuit in response to a control signal; each connection device in the plurality of connection devices comprises a set of controllable impedance devices, with one controllable impedance device for each pad, and with the impedances of two or more controllable impedance devices controlled by the control signal; and each connection device in the plurality of connection devices is configured to receive the control signal through a common signal line.

8. The integrated circuit die of claim 7, wherein a plurality of control signals are provided to the plurality of connection devices through a plurality of common signal lines.

9. The integrated circuit die of claim 7, wherein the plurality of connection devices are configured to selectively couple the at least two pads in each set of pads to a respective set of common nodes, and each common node is coupled to the circuit.

10. The integrated circuit die of claim 7, wherein at least one of the controllable impedance devices comprises a fuse.

11. The integrated circuit die of claim 7, wherein the plurality of sets of pads are a first plurality of sets of pads, and the first plurality of sets of pads are placed on a first face of the integrated circuit die, further comprising:
    a second plurality of sets of pads placed on a second face of the integrated circuit die, the first face of the integrated circuit die being distinct from the second face of the integrated circuit die.

12. The integrated circuit die of claim 7, wherein at least one of the pads in the plurality of sets of pads is an input pad for transmitting an input signal to the circuit.

13. The integrated circuit die of claim 7, wherein at least one of the pads in the plurality of sets of pads is an output pad for receiving an output signal from the circuit.

14. An integrated circuit package, comprising:
    a first integrated circuit die, comprising:
       a first circuit;
       a first plurality of sets of pads, each set of the first plurality of sets of pads comprising two pads, wherein each pad of the first plurality of sets of pads is configured for external connection;

a first plurality of controllable impedance devices, each pad in the first plurality of sets of pads selectively coupled through a respective controllable impedance device to one of a first plurality of common nodes, wherein each common node in the first plurality of common nodes is coupled to the first circuit; and a second integrated circuit die, comprising:

a second circuit; and a second plurality of sets of pads, wherein each pad of the second plurality of sets of pads is configured for external connection and each pad of the second plurality of sets of pads is configured to be selectively coupled to the second circuit, wherein at least one pad in the first plurality of sets of pads a programmable element is configured to control impedances of two or more of the first plurality of controllable impedance devices by providing a control signal to a common) signal line is coupled to at least one pad in the second plurality of sets of pads.

15. The integrated circuit package of claim 14, wherein at least one set of the second plurality of sets of pads comprises one pad.

16. The integrated circuit package of claim 14, wherein the first plurality of controllable impedance devices is configured to be programmable during packaging of the integrated circuit package.

17. The integrated circuit package of claim 14, further comprising:

a third integrated circuit die, comprising:

a third circuit; and a third plurality of sets of pads, wherein each pad of the third plurality of sets of pads is configured for external connection and each pad of the third plurality of sets of pads is configured to be selectively coupled to the third circuit, wherein at least one pad in the first plurality of sets of pads is coupled to at least one pad in the third plurality of sets of pads.

18. The integrated circuit package of claim 17, wherein the at least one pad in the first plurality of sets of pads is coupled to the at least one pad in the third plurality of sets of pads through at least one pad in the second plurality of sets of pads.

19. The integrated circuit package of claim 14, wherein the first integrated circuit die is substantially identical to the second integrated circuit die.

20. The integrated circuit package of claim 14, wherein a first signal applied to at least one of the first plurality of sets of pads has substantially the same timing characteristics a second signal applied to at least one of the second plurality of sets of pads.

21. The integrated circuit package of claim 14, wherein the first integrated circuit die comprises a memory array.

22. The integrated circuit package of claim 21, wherein the second integrated circuit die comprises a processor.

* * * * *

UNITED STATES PATENT AND TRADEMARK OFFICE
CERTIFICATE OF CORRECTION

| | |
|---|---|
| PATENT NO. | : 8,680,582 B2 |
| APPLICATION NO. | : 13/156265 |
| DATED | : March 25, 2014 |
| INVENTOR(S) | : Jake Anderson et al. |

It is certified that error appears in the above-identified patent and that said Letters Patent is hereby corrected as shown below:

In the Claims

In column 7, line 45, in claim 1, delete "sets," and insert -- sets --, therefor.

In column 9, line 19, in claim 14, delete "common)" and insert -- common --, therefor.

Signed and Sealed this
Twenty-ninth Day of July, 2014

Michelle K. Lee
*Deputy Director of the United States Patent and Trademark Office*